US 6,687,167 B2

(12) United States Patent
Guaitini et al.

(10) Patent No.: US 6,687,167 B2
(45) Date of Patent: Feb. 3, 2004

(54) EEPROM FLASH MEMORY ERASABLE LINE BY LINE

(75) Inventors: Giovanni Guaitini, Trecella (IT); Marco Pasotti, San Martino Siccomario (IT); Guido De Sandre, Brugherio (IT); David Iezzi, Osnago (IT); Marco Poles, Ghedi (IT); Pier Luigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/225,513

(22) Filed: Aug. 20, 2002

(65) Prior Publication Data

US 2003/0067804 A1 Apr. 10, 2003

(30) Foreign Application Priority Data

Aug. 30, 2001 (IT) .................................. RM2001A0525

(51) Int. Cl.[7] .............................................. G11C 16/04
(52) U.S. Cl. .............................. 365/189.09; 365/185.13
(58) Field of Search .................... 365/189.09, 185.13, 365/185.14, 185.23, 185.28, 185.29

(56) References Cited

U.S. PATENT DOCUMENTS

| | | | | |
|---|---|---|---|---|
| 6,122,200 A | * | 9/2000 | Campardo et al. | 365/185.23 |
| 6,181,606 B1 | * | 1/2001 | Choi et al. | 365/185.23 |
| 6,587,375 B2 | * | 7/2003 | Chung et al. | 365/185.13 |

* cited by examiner

Primary Examiner—Anh Phung
(74) Attorney, Agent, or Firm—Jenkens & Gilchrist, P.C.

(57) ABSTRACT

A non-volatile semiconductor memory device including an output connected to a row line and two supply terminals. Each elementary stage has an upper branch with a p-channel MOS transistor and a lower branch with an n-channel MOS transistor. In order to permit the memory to be erased line by line without having to use components capable of withstanding high voltages, each elementary stage has two supplementary MOS transistors, namely an n-channel transistor in the upper branch and a p-channel transistor in the lower branch. In this way it becomes possible to bias the elementary stages in such a manner the in the reading and programming phases the upper branch will function as pull-up and the lower branch as pull-down, while in the erasure phase the upper branch functions as pull-down and the lower branch as pull-up.

15 Claims, 7 Drawing Sheets n=nx+ny+nz
A={Ax,Ay,Az}

ILOG

WL_HV($2^n$-1)

EEPROM FLASH MEMORY ERASABLE LINE BY LINE

CROSS REFERENCE

This application claims foreign priority from Italian Patent Application No. RM2001A000525 filed on Aug. 30, 2001, the disclosure of which is hereby incorporated by reference.

BACKGROUND OF THE INVENTION

1. Technical Field of the Invention

The present invention relates to non-volatile semiconductor memories and, more particularly, an EEPROM flash memory capable of being erased line by line.

2. Description of Related Art

A typical EEPROM flash memory comprises a multiplicity of memory cells formed on a substrate of semiconductor material and ordered in such a way as to form a matrix. Each cell has a body region of type p conductivity in which there are formed two regions (source and drain) of type n conductivity separated by a channel region. A floating gate electrode is arranged above the channel region and insulated from it by a thin layer of dielectric material. A control gate electrode extends above the floating gate electrode and is insulated from it by another layer of dielectric material.

The matrix cells have their source regions connected to a common terminal that, during the programming and reading phase, is generally connected to the negative (ground) pole of the supply source of the integrated circuit of which the memory forms part. The drain regions of the cells of each column of the matrix are connected to each other by means of common connection lines, generally referred to as bit or column lines. The control gate electrodes of the cells of each row are interconnected by means of common connection lines that are known as word lines or row lines.

Each matrix cell can be selected by means of a row decoder and a column decoder. A cell is selected by applying appropriate potentials to its terminals and its state can be ascertained by placing a sense amplifier in series with the bit line concerned.

When a memory cell is to be written or programmed, the bit line and the word line that identify it are brought to voltages higher than the common source voltage, for example, respectively 5V and 9V, thus causing "hot electrons" to pass from the body region to the floating gate electrode. The electrons that accumulate in the floating gate electrode bring about an increase of the cell's threshold voltage (by 2–4V).

When the cell has to be read, the common source terminal is connected to ground, a positive voltage is impressed on the bit line (drain), the word line (control gate) is brought to a higher voltage than the bit line, and the drain current is then measured by means of the sense amplifier. A non-programmed cell (which is conventionally assigned the logic level "1") passes a relatively large current (for example 50 $\mu$A), while a programmed cell (logic level "0") will pass a considerably smaller current.

When a cell is to be erased, a positive potential (5V for example) is applied to the common source terminal, a negative potential (-8V for example) is applied to the word line (control gate), and the bit line (drain) is allowed to float. In these conditions a strong electrical field is developed between the floating gate electrode and the channel region, so that the negative charge constituted by the accumulated electrons is extracted from the floating gate electrode due to the tunnel effect.

Erasure in an EEPROM flash memory of the conventional type is effected simultaneously either for all the matrix cells or for all the cells of a selected matrix sector. Thanks to this erasure method it is not necessary to have a selection transistor for each cell (as in the case of individually erasable EEPROM memories) and this makes it possible to fabricate small-size cells and therefore to obtain considerable advantages in terms of area and fabrication yield. However, this advantage has to be paid for in terms of reduced use flexibility of the memory.

With a view to extending the use of memories of this type to applications in which even a partial erasure of the memory is possible, it has been proposed to associate a buffer and appropriate transfer circuits with the memory in such a way as to temporarily save the contents of every sector in which a modification has to be effected. This solution requires supplementary integrated circuit area to be dedicated to the buffer and the transfer circuits, so that it is not always acceptable.

A method has also been proposed (see, U.S. Pat. No. 6,122,200) for erasing only one sector row at a time by applying a high negative voltage (-8V for example) to the row line to be erased, i.e. to the gate electrodes of all the cells of the row to be erased, and a high positive voltage (8V for example) to both the common node of all the source electrodes of the sector and the row lines of the cells that are not to be erased. When this is done, only the cells that are to be erased will effectively be in an erasure condition. But this solution is also associated with drawbacks. In particular, it creates two practical problems in the design of the row decoder circuits: the first is the realization of MOS transistors capable of withstanding the very high voltage drop caused by the simultaneous presence of both negative and positive voltages in the circuit (typically a high-voltage MOS transistor realized by present-day integrated circuit fabrication technologies cannot withstand more than 10V between two of its terminals); the second is the difficulty experienced in designing a decoder circuit capable of conciliating the functioning in the reading and programming phases, in which the selected row is at a high voltage and the non-selected rows are at ground potential (0V), with the functioning in the erasure phase, when the selected row (i.e. the one to be erased) is at a negative voltage and all the other rows are at a positive voltage.

One of the aims of the present invention is to propose an EEPROM flash memory that can be erased line by line and will permit this to be done without requiring decoder circuits with components capable of withstanding high voltages. Another aim of the invention is to propose a method of reading, programming and erasing a memory that will make it possible to optimize the functioning of the memory in the reading/programming phase and the erasing phase.

SUMMARY OF THE INVENTION

An EEPROM memory array includes a plurality of word lines. Each word line includes a first pull branch and second pull branch connected thereto. In operation of the memory array for reading/programming of memory cells associated with a certain word line, the first pull branch is activated for only that certain word line as a pull-up, with the second pull branches for the other word lines being activated as pull-downs. Conversely, in operation of the memory array for erasure of memory cells associates with a certain word line, the first pull branch is activated for only the certain word lines as a pull-down, with the second pull branches for the other word lines being activated as pull-ups.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
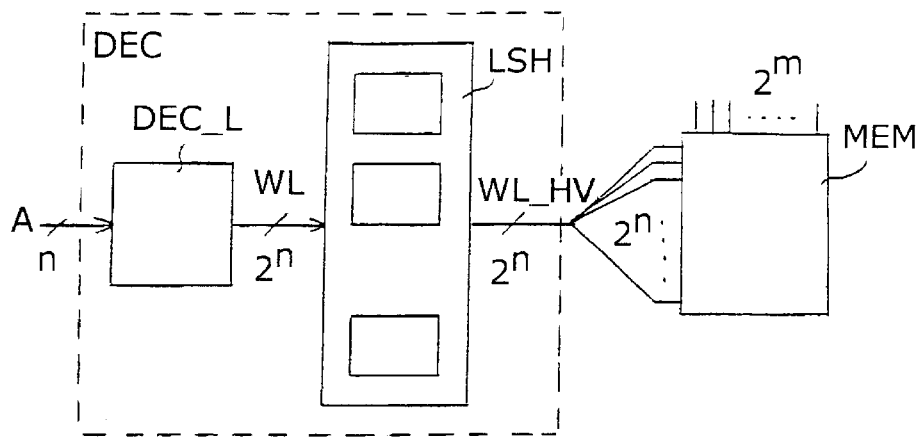
FIG. 1 is a block diagram of an EEPROM flash memory that shows some parts of the row decoder.

FIG. 1 shows the schematic layout of an EEPROM flash memory consisting of a matrix MEM of cells ordered in 2n rows and 2n columns and a row decoder DEC comprising a decoder logic unit DEC_L and a level conversion unit LSH.

In this layout, n input (or address) signals A are needed for selecting each of the rows of the matrix. These signals are generated by an appropriate logic unit (not shown in the FIG. 1) and applied as input to the decoder DEC. The output of the unit DEC_L is constituted by 2n lines, each of which is connected by means of a level conversion element of the conversion unit LSH to a word line of the matrix MEM.

The level converter elements have the task of transforming the levels of the binary digital signals, which usually consist of the ground level (0V or logic level "0") and the supply level VDD (1.8V or logic level "1"), into corresponding relatively high levels, for example:

"0"=−HVNEG=−10V,

"1"=HVPOS=+10V.

Figure 2:
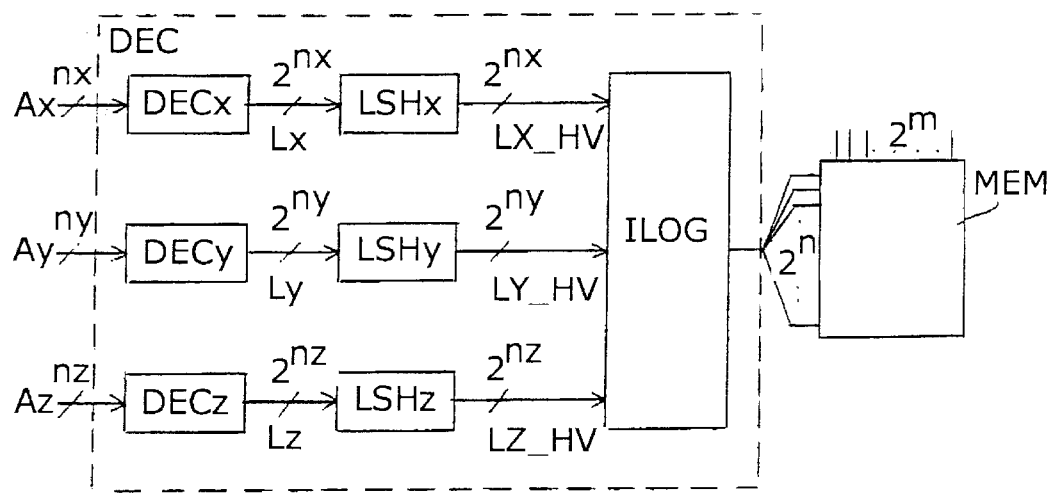
FIG. 2 is a block diagram of an EEPROM flash memory that shows a row decoder with pre-encoder.
Figure 3:
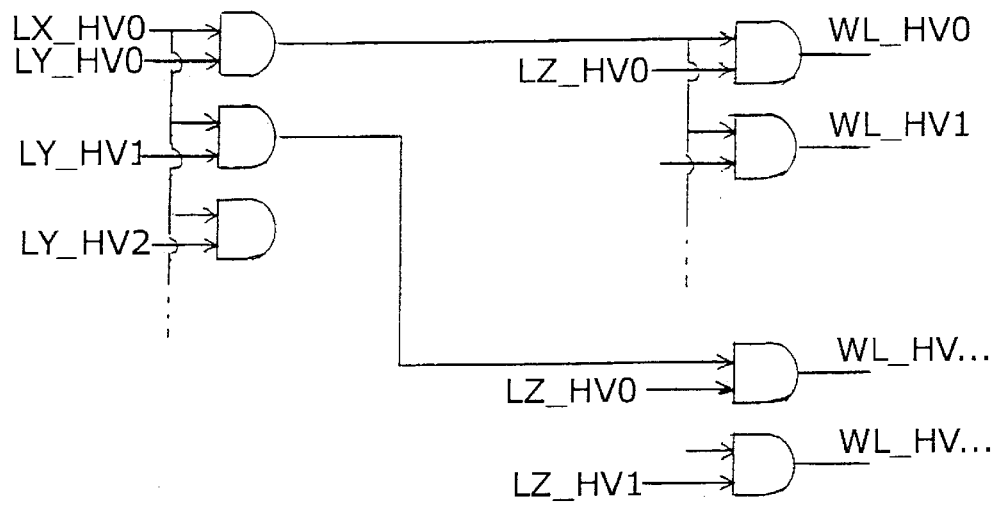
FIG. 3 is partial logic diagram of an interface circuit of a row decoder.
Figure 3:
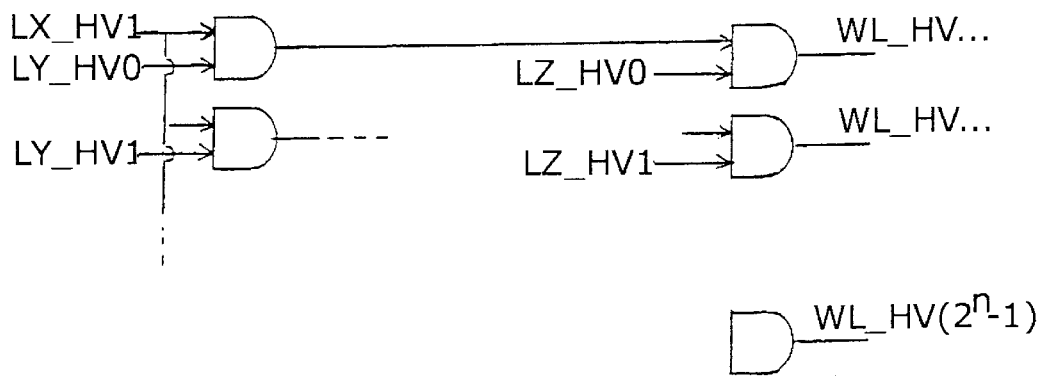

The use of pre-encoding circuits is known as a means of reducing the number of connection lines to the matrix. These circuits subdivide the n address bits into smaller groups that, when applied to the respective decoders, give rise to intermediate signals. A circuit of this type is shown in FIG. 2. The n address signals A are subdivided into three groups A=[Ax, Ay, Az] and are applied as inputs to respective decoder elements (DECx, DECy, DECz) in groups nx, ny, nz (where nx+ny+nz=n). The number of intermediate signals Lx, Ly, Lz on the output side of the decoder elements is smaller than the number 2n that would have been obtained in accordance with the layout of FIG. 1 (2nx+2ny+2nz<2n) and therefore calls for a correspondingly smaller number of level converter elements LSHx, SHy, LSHz. Consequently, the array of decoder elements and level converters occupies a correspondingly smaller area. The outputs of the level converter elements are applied to the word lines of the matrix MEM through a final or interface logic stage ILOG that has the task of reducing the number of lines for connection to the matrix. The final stage ILOG can have an AND logic gate structure, as shown in FIG. 3, and is preferably realized on an area adjacent to one side of the cell matrix MEM. The stage ILOG has 2n output lines, indicated by WL_HV0-WL_HV (2n−1), each of which is connected to a word line of the matrix MEM (not shown in FIG. 3).

The AND gates are high-voltage gates; they are not energized directly by the supply voltage of the integrated circuit (ground, VDD), but generally by a higher voltage, comprised between a positive value and a negative value.

Figure 4:
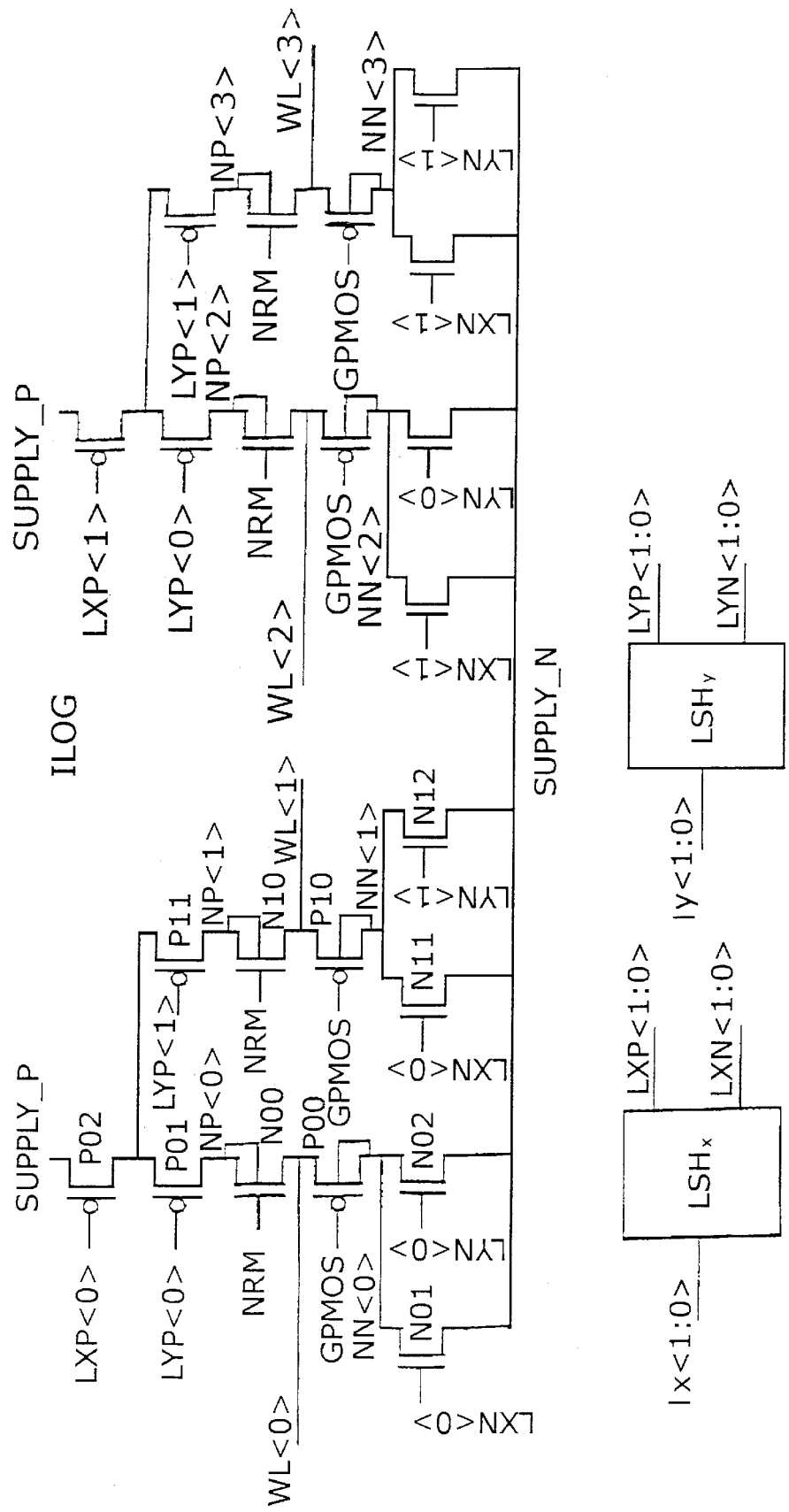
FIG. 4 shows the layout, partly as a block diagram and partly as a circuit diagram, of some elements of an interface circuit of a row decoder of an EEPROM flash memory in accordance with the invention.

A number of the elementary components of an interface stage ILOG in accordance with the invention are shown in FIG. 4.

For the sake of simplicity we shall here consider the case in which the address signals are subdivided into no more than two groups lx and ly and therefore the intermediate signals LX and LY are likewise in groups of two. FIG. 4 shows four elements or elementary stages for biasing four logic interface word lines WL<0>, WL<1>, WL<2> and WL<3>. These four elements have their respective inputs connected to the outputs of two level converter elements LSHx and LSHy, which have their inputs connected to the outputs lx<1:0> and ly<1:0> of two pre-encoders (not shown in the FIGURE). Each interface element comprises a lower or "pull-down" branch connected between the respective output WL and a first supply terminal SUPPLY-N and an upper or "pull-up" branch connected between the output WL and a second supply terminal SUPPLY-P. The lower branch of the element WL<0> that drives the line WL<0> comprises two n-channel MOS transistors, N01 and N02, connected with their source-drain paths in parallel with each other and a p-channel MOS transistor, P00, connected with its source-drain path between the output WL<0> and the two n-channel transistors in parallel. The upper branch comprises two p-channel MOS transistors, P01 and P02, connected to each other with their source-drain paths in series and an n-channel MOS transistor, N00, connected with its source-drain path between the output WL<0> and the two series connected transistors P01 and P02. The p-channel transistor P02, connected to the supply terminal SUPPLY_P, is in common with the upper branch of the element of the interface stage that drives the line WL<1>. This stage is made up of transistors N11, N12, P11, N10 and P10 equal to the transistors N01, N02, P01, N00 and P00 and connected in altogether analogous fashion. The n-channel transistors N00 and N10 of the upper branches and the p-channel transistors P00 and P10 of the lower branches have their respective body regions connected to the respective drain regions and their gate terminals (NRM, GPMOS) connected to respective terminals of a biasing source. The gate terminals of the two n-channel transistors of each pull-down branch, like N01 and N02, and those of the two p-channel transistors of each pull-up branch, like P01 and P02, constitute the inputs of the interface stage elements and are connected to respective outputs LXN, LYP of the level converter elements LSHx and LSHy.

The interface stage ILOG in accordance with the invention differs from a similar stage of the conventional type by virtue of the fact that each of its elements comprises an n-channel transistor in the upper branch and a p-channel transistor in the lower branch and also the fact that the inputs of each element are insulated from each other and can therefore be controlled by different signals (in a similar stage of the conventional type each of the gate terminals of the p-channel transistors of the upper branch would be connected to a respective gate terminal of one of the n-channel transistors of the lower branch).

Figure 5:
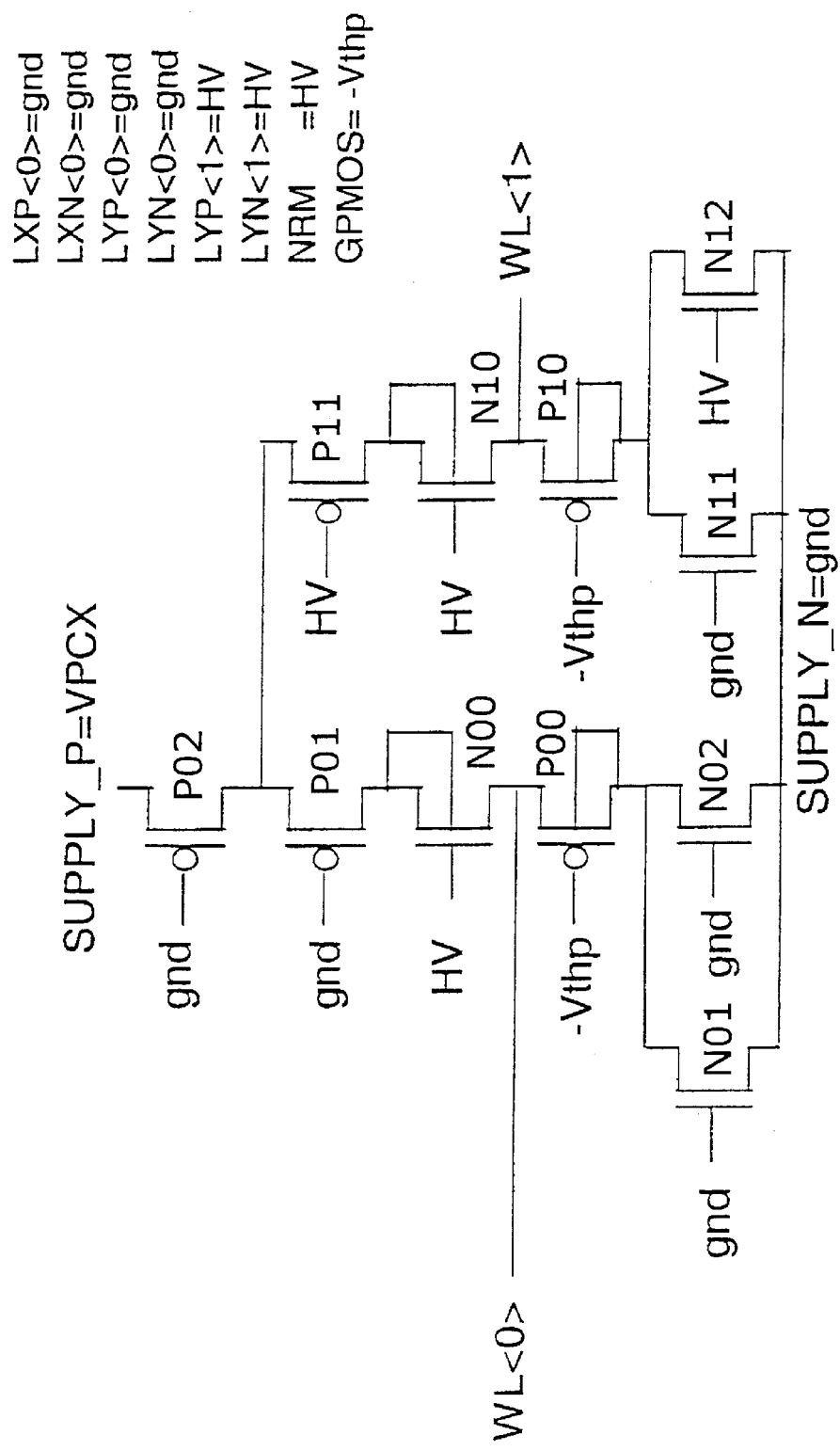
FIG. 5 shows a layout similar to the one of FIG. 4 that illustrates the functioning of the interface circuit of the row decoder in the memory reading/programming phase.
Figure 6:
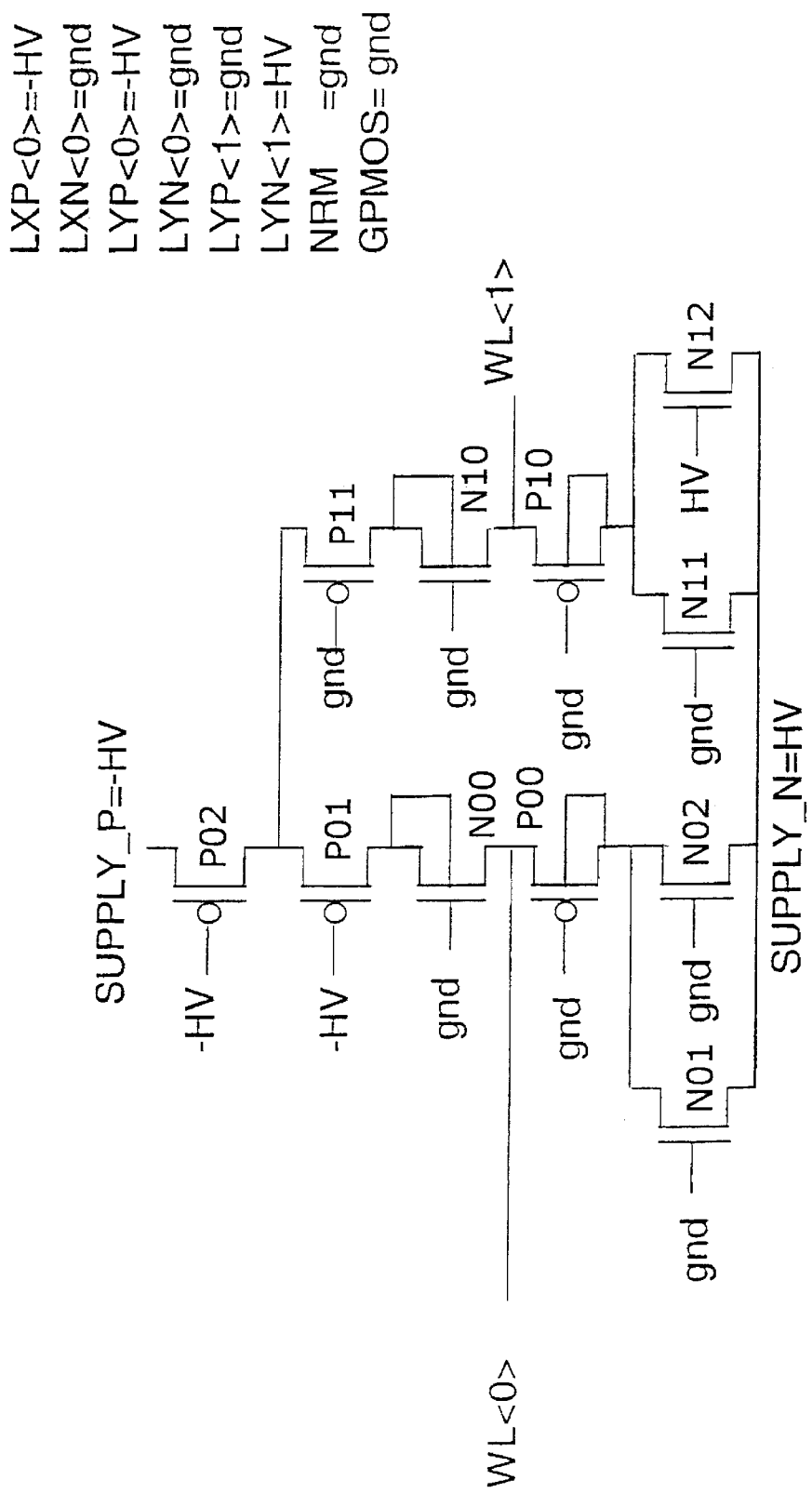
FIG. 6 shows a layout similar to the one of FIG. 4 that illustrates the functioning of the interface circuit of the row decoder in the phase of erasing a row of the memory.
Figure 7:
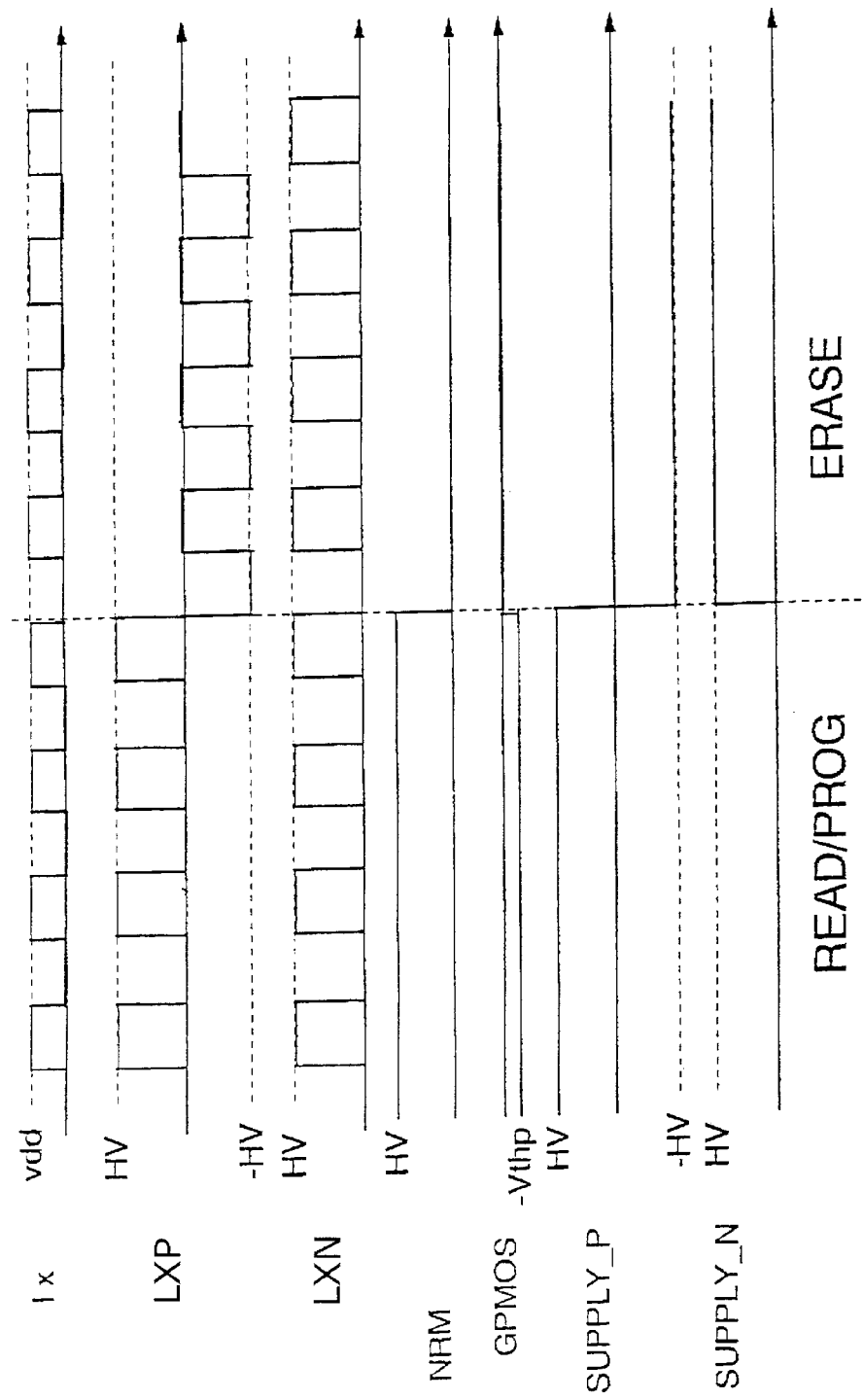
FIG. 7 shows the levels of some pilot signals and some biasing voltages of a row decoder of a memory in accordance with the invention in the reading and programming phases (READ/PROG) and the erasing phase (ERASE)

Referring to FIGS. 5, 6 and 7, let us now consider the circuit of FIG. 4 in the various functioning phases of the memory.

FIG. 5 shows the biasing of two elements of an interface stage ILOG that controls two word lines, one (WL<0>) selected for reading-programming and the other (WL<1>) non-selected.

During the reading phase and the programming phase of a cell of the line WL<0> the situation is as follows: to the supply terminal SUPPLY_P there is applied the positive voltage, indicated by VPCX, necessary to bias the selected word line WL<0> in respectively, reading and programming; the supply terminal SUPPLY_N is connected to the ground terminal (gnd); to the gate terminal NRM of the n-channel transistor N00 there is applied a positive voltage HV, preferably the highest voltage available in the integrated circuit; to the gate terminal GPMOS of the p-channel transistor P00 of the lower branch there is applied a relatively low voltage (−Vthp). In this phase the signals LXP<0> and LYP<0> applied to the gate terminals of the p-channel transistors P01 and P02 may be at a low level (ground potential, or gnd) or at a high level (the highest positive potential HV). The same applies as regards the signals LXN<0> and LYN<0> applied to the gate terminals of the n-channel transistors N01 and N02. When the four signals are all at a low level, as in the case of the pilot element of WL<0> in FIG. 5, the two p-channel transistors of the upper branch are on (biased in conduction) and all the transistors of the lower branch are off (biased in non-conduction), so that the associated word line WL<0> will assume a voltage close to the positive voltage VPCX applied to the terminal SUPPLY_P. More precisely, for as long as the value of the voltage VPCX remains smaller than the maximum voltage HV minus the threshold voltage of the n-channel transistor N00, the voltage of the word line WL<0> will be equal to VPCX, but thereafter, i.e. at higher voltages VPCX, this voltage will remain constant. With all the other possible combinations of the four signals, at least one p-channel transistor of the upper branch will be off and at least one n-channel transistor of the lower branch will be on, so that, since the p-channel transistor (P00, P10) of the lower branch is biased in conduction, the associated word line (WL<1> in FIG. 5) will come to be substantially at the potential of the terminal SUPPLY_N, that is to say, at ground potential.

It should also be noted that when a word line is selected for reading or programming, the n-channel transistor of the pull-up branch has its body region, which is connected to the drain region, at a potential higher than the potential of its source terminal, which is connected to the word line, so that the source-body junction is biased in direct conduction. In this phase this circumstance is advantageous, because the current that passes through the junction comes to be added to the current passing through the channel, thus facilitating the charging of the parasite capacitance of the word line. A similar consideration can be made as regards the p-channel transistor of the lower branch: the body region, which is connected to the drain region, is at a lower potential than the potential of the source terminal, so that the source-body junction is biased in conduction. This is not very important in the phase in which the two n-channel transistors of the lower branch are off, but becomes important when at least one of these transistors is in conduction, i.e. in the case of a non-selected word line. In this case the direct conduction through the junction facilitates the discharge of the capacitance of the corresponding word line. With a view to avoiding the switching on of parasite diodes, it is desirable for the body regions of the p-channel transistors of the upper branch, as also the outermost insulation region of the n-channel transistor of the same branch, to be kept at the same high voltage HV as is applied to the gate terminal NRM of the n-channel transistor of the upper branch.

In the example here shown and described the n-channel transistor of the upper branch and the p-channel transistor of the lower branch have their respective body regions connected to their respective drain regions in order to bias the body regions at voltages that are, respectively, higher and lower than those of their respective source regions. As a general rule, the same result can be obtained by connecting the body regions to specific biasing terminals.

The situation in the erasure phase (FIG. 6) is as follows: the supply terminal SUPPLY_P is brought to the high negative voltage (−HV) that is to be applied to a word line due to be erased; the supply terminal SUPPLY_N is brought to the high positive voltage (HV) to be applied to the high positive voltage (HV) to be applied to the word lines that are not to be erased; the gate terminal of the n-channel transistor of the upper branch and the gate terminal of the p-channel transistor of the lower branch of the pilot element of the word line to be selected for erasure are brought to ground potential. In this phase the signals LXN and LYN applied to the gate terminals of the n-channel transistors of the lower branch can be at ground potential (gnd) or at the maximum positive voltage (HV) as in the reading-programming phases, while the signals LXP and LYP applied to the gate terminals of the p-channel transistors of the upper branch undergo a level translation: the high level, which corresponds to the maximum positive voltage, is shifted to ground level and the low level, which corresponds to ground potential, is shifted to the maximum negative voltage. FIG. 6 shows the biasing of two elements of an interface stage iLOG that controls two word lines, one (WL<0>) selected for erasure and the other (WL<1>) non-selected. As can be seen, the line driving elements are in practice reversed: the two upper p-channel transistors now function as pull-down devices, while the two lower n-channel transistors function as pull-up devices. The driving element of the word line WL<0> selected for erasure now has its pull-up branch off and its pull-down branch on, so that the negative voltage −HV of the supply terminal SUPPLY_P is applied to the line WL<0>, while all the other driving elements have their pull-up branch on and their pull-down branch off, so that the respective lines (like WL<1> in FIG. 6) are at the positive voltage HV of the supply terminal SUPPLY_N. The n-channel transistor of the upper branch and the p-channel transistor of the lower branch are likewise reversed in practice and also have their functions changed. In fact, the p-channel transistor of the lower branch now has the function of separating the lower branch from the upper branch when the word line associated with the driving element is selected for erasure, so that none of the transistors will be subject to the difference between the maximum positive voltage and the maximum negative voltage, while the n-channel transistor of the upper branch performs the same function for the driving elements of the lines not selected for erasure.

As clearly brought out by the above remarks, the decoder in accordance with the invention does not call for transistors capable of withstanding high voltages, because the maximum voltage to which any one of its transistors is subjected during the functioning of the memory is just the maximum negative voltage or the maximum positive voltage, but never the sum (in absolute value) of the maximum negative voltage and the maximum positive voltage. It is therefore possible to use transistors occupying a small area and save integrated circuit area. The only supplementary components are the n-channel transistors of the upper branches and the p-channel transistors of the lower branches, which have to be realized in regions insulated from the body regions of the other transistors, for example, by making use of the so-called "triple well" technique. In spite of this, the overall balance in terms of area is extremely positive. As far as the actual functioning is concerned, the only thing that has to be borne in mind is that the voltage effectively applied to the word line is smaller than that of the supply terminals by the value of a threshold voltage, this on account of the presence of an n-channel transistor in the upper branch and a p-channel transistor in the lower branch.

Figure 8:
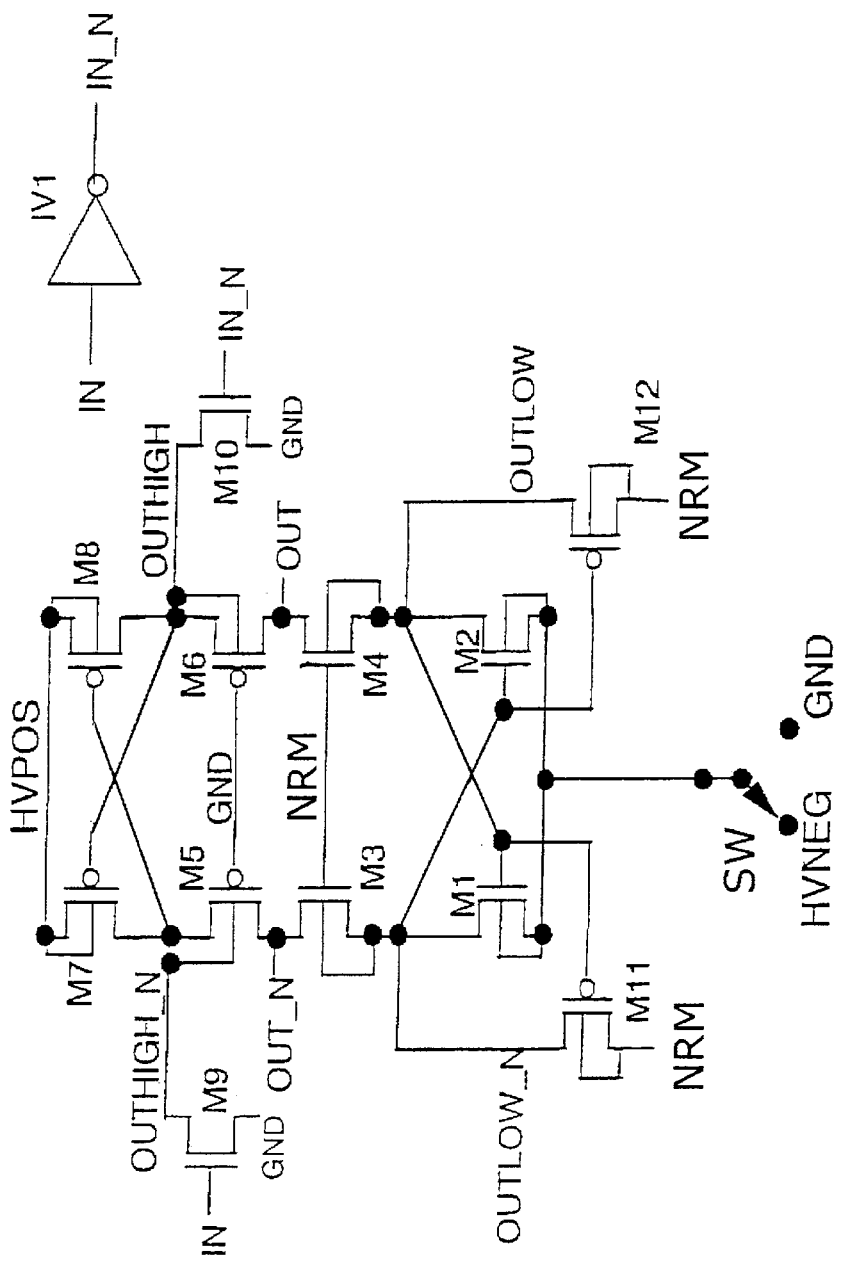
FIG. 8 shows the circuit diagram of a level converter that can be used in the decoder in accordance with FIG. 4.

A circuit that can be advantageously used for the level converters LSHx and LSHy of FIG. 4 is shown in FIG. 8. The circuit is provided with two pairs of MOS transistors connected, as can be seen, for positive feedback and, more precisely, with two p-channel MOS transistors (hereinafter referred to more briefly as pmos), M7 and M8, and two n-channel MOS transistors (hereinafter referred to more briefly as nmos), M1 and M2. Another pair of pmos, M5 and M6, and another pair of nmos, M3 and M4, (connected as shown in the FIGURE) protect the circuit against overvoltages. A pair of pmos, M11 and M12, serves to avoid voltage losses due to the thresholds of M3 and M4, as will become clear further on. The input signal IN is applied to the gate terminal of M8 by means of an nmos M9 and the negated input signal IN_N (obtained from the signal IN by means of an inverter IV1) is applied to the gate terminal of M7 by means of an nmos M10. The voltages applied to the terminals HVPOS and HVNEG are, respectively, the maximum positive supply voltage and the maximum negative supply voltage that may have to be withstood by the integrated circuit of which the level converter forms part. The negative supply terminal of the circuit may be switched, by means of the switch SW, between the terminal HVNEG and the ground terminal GND. A voltage NRM is applied to the gate terminals of M3 and M4.

With a view to examining the functioning of the circuit, let us now assume that we want to have a signal variable between +10V and −10V at the output terminal OUT. To this end we shall apply a voltage of −10V to the terminal HVNEG, the switch SW will be in the position shown in the FIGURE and the voltage NRM will be at the low level. The circuit, as readily brought out by its structure, is a bistable system, so that it will initially be in one of two states, in which either OUT will be at −10V and OUT_N at +10V or, alternately, OUT will be at +10V and OUT_N will be at −10V. Let us suppose that the circuit is in the first of these states, i.e. with the input signal IN initially low. Analyzing the circuit, it can be seen that when the signal IN_N is high, M10 is on, so that the node OUTHIGH will be at ground potential (GND), while the node OUTHIGH_N will be at +10V, just like OUT_N. The node OUTLOW will be at −10V, just like the node OUT. The node OUTLOW_N will be at ground potential (GND), because—with NRM low (ground) and OUTLOW very negative—M11 will be on. On the other hand, M12 is driven by OUTLOW_N and, seeing that it also has its source at ground potential, will be off. It should be noted that M11 and M12 serve only to avoid the output signal becoming lower than the maximum voltage of HVPOS less the threshold voltage of an nmos (10V−Vthn); whenever such a lowering can be accepted, M11 and M12 could therefore be omitted.

It can readily be seen that the total voltage drop (20V) becomes distributed between several transistors. In the left-hand branch of the circuit, M3 and M1 each withstands a voltage drop of 10V between drain and source. The same can be said as regards M8 and M6 in the right-hand branch.

When the input signal IN switches to the high logic level and the signal IN_N switches to the low logic level, M9 comes on and M1 goes off. Supposing that M9 and M10 are designed in such a manner as to have conductivities that are greater than those of, respectively, M7 and M8, the capacitance associated with the node OUTHIGH_N will tend to become discharged until, at a certain point, M8 comes on and will therefore charge the capacitance associated with the node OUTHIGH, so that M7 will tend to switch off. This causes a further lowering of the voltage of the node OUTHIGH_N, thus triggering a self-regenerating mechanism that should lead to the switching of the circuit. It should however be noted that a part of the current output of M8 will tend to pass, through M6 and M4, towards the drain of M2, i.e., towards the node OUTLOW. If the switching is to take place, an appropriate design must therefore ensure that the voltage at the node OUTLOW will commence to rise. When this is the case, the voltages of the nodes OUTHIGH and OUTHIGH_N will begin to switch, and with them also the voltages of the nodes OUTLOW and OUTLOW_N. When OUTLOW rises, M1 will sooner or later come on, and this will cause the capacitance associated with OUTLOW_N to become discharged. At the end of the process the node OUTHIGH will be at 10V, the node OUTHIGH_N will be at 0V (ground), OUTLOW will be at 0V (if M12 is present), the node OUTLOW_N will be at −10V and, above all, the node OUT will be at 10V and the node OUT_N will be at −10V. In other words, a voltage drop of 20V is obtained between the two outputs without any one of the transistors having to withstand a voltage of more than 10V.

It should be noted that not only do the voltages of the nodes OUT and OUT_N switch between −10V and +10V, but the voltages of the nodes OUTHIGH and OUTHIGH_N switch in a corresponding manner between 0 and 10V, while those of the nodes OUTLOW and OUTLOW_N switch between −10V and 0: the circuit therefore has three different types of output that can be used in accordance with the particular requirements for simultaneously driving circuits with different maximum permissible voltages.

The circuit shown in FIG. 8 is protected against overvoltages and can provide all the necessary voltages. In particular, it can provide the maximum voltage excursion (from −10V to +10V) when the switch SW is in the position in which the circuit is connected to HVNEG and the lowest voltage excursion (from +10V to 0) when the switch SW is in the position in which the circuit is connected to the ground terminal (GND) and the signal NRM is at the high level. In this latter condition, the switches M3 and M4 no longer function as protection devices (protection, in any case, is not necessary in this condition), but simply function as closed switches, so that M1 and M2 can work at positive voltages. If in this condition NRM assumes a value equal to HVPOS, OUTHIGH, OUT and OUTLOW will become coincident signals and their excursions will all be from 0 to 10V, the same as regards OUTHIGH_N, OUT_N and OUTLOW_N.

The properties of this circuit can be exploited to generate the supply and control voltages of the row decoder described with reference to FIG. 4.

Utilizing a first circuit of the type shown in FIG. 8, energized by the maximum negative voltage, with the gates of M3 and M4 kept constantly at ground potential rather than at NRM, and driven by a digital "erase" signal, the outputs OUT_N, OUTHIGH and OUTHIGH_N can be used to generate, respectively, SUPPLY_P, SUPPLY_N and NRM. When erase=0, SUPPLY_P=HV, SUPPLY_N=gnd, NRM= HV. When erase=1, SUPPLY_P=-HV, SUPPLY_N=HV, NRM=0.

Lastly, a second circuit of the same type, which utilizes NRM generated in the manner just described and is driven by the signal lx, generates the signals LXP and LXN at, respectively, the outputs OUTLOW and OUTHIGH.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An EEPROM flash memory capable of being erased line by line and comprising:

a matrix (MEM) of cells connected to each other by means of row lines and column lines, row decoder circuits (DEC) comprising logic decoder units (DECx-z), voltage level conversion units (LSHx-z) and interface logic stages (ILOG) between the level conversion units (LSHx-z) and the row lines of the matrix, each interface stage comprising elementary row driving stages, each of which has inputs connected to corresponding outputs of the level conversion units (LSHx-z), an output connected to a row line (WL) and a first (SUPPLY_P) and a second (SUPPLY_N) supply voltage terminal and comprises a first branch comprising a first MOS transistor (P01) of a first type, connected with its source drain-path between the output (WL) and the first (SUPPLY_P) supply terminal and a second branch comprising a second MOS transistor (N01) of second type, connected with its source-drain path between the output (WL) and the second (SUPPLY_N) supply terminal, the gate terminals of the first and the second MOS transistor being two inputs of the elementary row driving stage, characterized in that each elementary row pilot stage comprises:

in the first branch a first supplementary MOS transistor (N00) of the second type (n), connected with its source-drain path in series with the first MOS transistor (P01) and with its gate terminal connected to a first biasing terminal (NRM), and in the second branch a second supplementary MOS transistor (P00) of the first type (p), connected with its source-drain path in series with the source-drain path of the second MOS transistor (N01) of the second type (n) and with its gate terminal connected to a second biasing terminal (GPMOS).

2. The memory in accordance with claim 1, wherein the second supply terminals (SUPPLY_N) of the elementary stages are connected to a common terminal.

3. The memory in accordance with claim 2, wherein each elementary row driving stage comprises a third MOS transistor (N02) of the second type connected with its source-drain path in parallel with the source-drain path of the second MOS transistor (n01) of the second type, the gate terminal of the third MOS transistor being connected, as a further input of the stage, to a corresponding output of the voltage level conversion unit (LSHx,y).

4. The memory in accordance with claim 3, wherein the elementary stages are connected pair by pair to the first supply terminal (SUPPLY_P) by means of the source-drain path of a fourth MOS transistor (P02) of the first type having its gate terminal connected, as a further input of the pair of elementary stages, to a corresponding output of the voltage level conversion unit (LSHx,y).

5. A method of reading, programming and erasing a memory comprising:

a matrix (MEM) of cells connected to each other by means of row lines and column lines, row decoder circuits (DEC) comprising logic decoder units (DECx-z), voltage level conversion units (LSHx-z) and interface logic stages (ILOG) between the level conversion units (LSHx-z) and the row lines of the matrix, each interface stage comprising elementary row driving stages, each of which has inputs connected to corresponding outputs of the level conversion units (LSHx-z), an output connected to a row line (WL) and a first (SUPPLY_P) and a second (SUPPLY_N) supply voltage terminal and comprises a first branch comprising a first MOS transistor (P01) of a first type, connected with its source drain-path between the output (WL) and the first (SUPPLY_P) supply terminal and a second branch comprising a second MOS transistor (N01) of second type, connected with its source-drain path between the output (WL) and the second (SUPPLY_N) supply terminal, the gate terminals of the first and the second MOS transistor being two inputs of the elementary row driving stage, wherein the polarizations of the elementary row driving stages during the phases or reading and programming a cell of a row are chosen in such a manner that the first and the second branch of the elementary row driving stage function, respectively, as a pull-up branch and a pull-down branch, and wherein the polarizations of the elementary row driving stages during the phase of erasing a cell of a row are chosen in such a manner that the first and the second branch of the elementary row driving stage function, respectively, as a pull-down branch and a pull-up branch.

6. The method in accordance with claim 5, wherein the body regions of the first (N00) and the second (P00) supplementary MOS transistor during the reading and programming phases are biased to voltages that are, respectively, higher and lower than the voltages of their respective source regions.

7. An EEPROM memory array word line control circuit, comprising, for each of a plurality of word lines in the memory array:

a first pull circuit connected between each word line of the memory and a first voltage supply node, the first pull circuit including a first transistor of a first conductivity type;

a second pull circuit connected between each word line of the memory and a second voltage supply node, the second pull circuit including a second transistor of a second conductivity type;

wherein reading/programming of the certain word line is effectuated by biasing the first and second transistors high and relatively low, respectively, and configuring the first pull circuit for the certain word line as a pull-up and the second pull circuit for other word lines as a pull-down; and wherein erasure of memory cells associated with only the certain word line is effectuated by biasing the first and second transistors to ground and configuring the first pull circuit as a pull-down for the certain word line and the second pull circuit for other word lines as a pull-up.

8. The circuit as in claim 7 wherein:

the first pull circuit further includes a third transistor of the second conductivity type; and the second pull circuit further includes a fourth transistor of the first conductivity type;

wherein during reading/programming of the certain word line, the third and fourth transistors are biased to ground; and wherein during erasure of only the certain word line, the third and fourth transistors are biased to a negative voltage and ground, respectively.

9. The circuit as in claim 7 wherein the first and second transistors each have body regions connected to their respective drain regions.

10. The circuit as in claim 7 wherein, during reading/programming of the certain word line, the first and second transistors are biased with their respective source-body junctions in direct conduction.

11. A method for operating an EEPROM memory array, wherein each of a plurality of word lines includes a first pull branch and second pull branch connected to the word line, comprising the steps of:

for reading/programming: activating the first pull branch for only a certain one of the word lines as a pull-up and activating the second pull branches for the other word lines as pull-downs; and for erasure: activating the first pull branch for only the certain one of the word lines as a pull-down and activating the second pull branches for the other word lines as pull-ups.

12. The method as in claim 11 wherein, during reading/programming of the certain word line, a transistor in the first pull branch is biased with its source-body junction in direct conduction.

13. An EEPROM memory array word line control circuit, comprising, for each of a plurality of word lines in the memory array:

a first pull circuit connected to a word line; and a second pull circuit connected to the word line;

wherein reading/programming of memory cells associated with a certain word line is effectuated by configuring the first pull circuit for the certain word line as a pull-up and the second pull circuit for other word lines as a pull-down; and wherein erasure of memory cells associated with only the certain word line is effectuated by configuring the first pull circuit as a pull-down for the certain word line and the second pull circuit for other word lines as a pull-up.

14. The circuit as in claim 13 wherein:

the first and second pull circuits each include a transistor having its body region connected to its drain region.

15. The circuit as in claim 14 wherein, during reading/programming of the certain word line, the first and second transistors are biased with their respective source-body junctions in direct conduction.

* * * * *